United States Patent
Bibl et al.

(10) Patent No.: US 7,344,228 B2
(45) Date of Patent: Mar. 18, 2008

(54) ACTUATOR WITH REDUCED DRIVE CAPACITANCE

(75) Inventors: Andreas Bibl, Los Altos, CA (US); Jeffrey Birkmeyer, San Jose, CA (US)

(73) Assignee: FUJIFILM Dimatix, Inc., Lebanon, NH (US)

( * ) Notice: Subject to any disclaimer, the term of this patent is extended or adjusted under 35 U.S.C. 154(b) by 160 days.

(21) Appl. No.: 10/910,450

(22) Filed: Aug. 2, 2004

(65) Prior Publication Data

US 2006/0023032 A1    Feb. 2, 2006

(51) Int. Cl.
*B41J 2/045* (2006.01)
(52) U.S. Cl. ............................................. 347/68
(58) Field of Classification Search ............. 347/68, 347/70–72; 29/25.35
See application file for complete search history.

(56) References Cited

U.S. PATENT DOCUMENTS

| | | | |
|---|---|---|---|
| 6,088,893 A | | 7/2000 | Takeuchi et al. |
| 6,089,701 A | * | 7/2000 | Hashizume et al. ......... 347/70 |
| 6,315,400 B1 | * | 11/2001 | Sakai et al. .................. 347/70 |
| 6,840,601 B2 | | 1/2005 | Miyata |
| 6,929,355 B2 | * | 8/2005 | Matsuzawa ................... 347/71 |
| 6,973,703 B2 | * | 12/2005 | Sakaida et al. ............ 29/25.35 |
| 2003/0127946 A1 | | 7/2003 | Yamada et al. |
| 2003/0214564 A1 | | 11/2003 | Miyata |
| 2004/0108790 A1 | | 6/2004 | Junhua et al. |

FOREIGN PATENT DOCUMENTS

| EP | 1 256 450 A1 | 11/2002 |
|---|---|---|
| EP | 1 350 625 A2 | 10/2003 |

OTHER PUBLICATIONS

International Search Report and Written Opinion of the International Searching Authority, International Application Serial No. PCT/US2005/027752, Jan. 24, 2006, 10 pp.

* cited by examiner

*Primary Examiner*—An H. Do
(74) *Attorney, Agent, or Firm*—Fish & Richardson P.C.

(57) ABSTRACT

Techniques are provided for reducing the amount of power required to activate a piezoelectric actuator of a microelectromechanical structure. An insulating layer is deposited on a piezoelectric layer. The insulating layer is etched to remove a portion of the layer and expose the piezoelectric layer in the etched areas. An electrode layer is deposited on the piezoelectric layer and insulating layer.

23 Claims, 6 Drawing Sheets

PRIOR ART

ACTUATOR WITH REDUCED DRIVE CAPACITANCE

BACKGROUND

This invention relates to a device actuator structure in a microfabricated electromechanical device.

Ink jet printers form an image by selectively depositing ink onto a receiving media. In a conventional ink jet printer system, the ink is stored in an ink storage unit, such as an ink reservoir or cartridge, and directed from the storage unit into a printhead, such as the printhead 100 shown in FIG. 1. In the printhead 100, ink flows into an ink pumping chamber 120 and to a nozzle 130, where the ink is ejected. Typically, the printhead includes an actuator that forces ink out of the printhead 100 through the nozzle 130. Two common types of actuators include resistive heating actuators and piezoelectric actuators. In a piezoelectric actuator 150, a layer of piezoelectric material 165 can be formed adjacent to the ink pumping chamber 120. Applying a voltage across the piezoelectric material 165 causes the piezoelectric material to bend or deform. The deformation of the piezoelectric material 165 causes a pressure wave to propagate through the ink pumping chamber 120, pushing ink out of the nozzle 130 and onto the receiving media. Typically, electrodes 160, 170 are formed on either side of the piezoelectric layer 165 to enable voltage to be applied across the layer 165.

Figure 1:
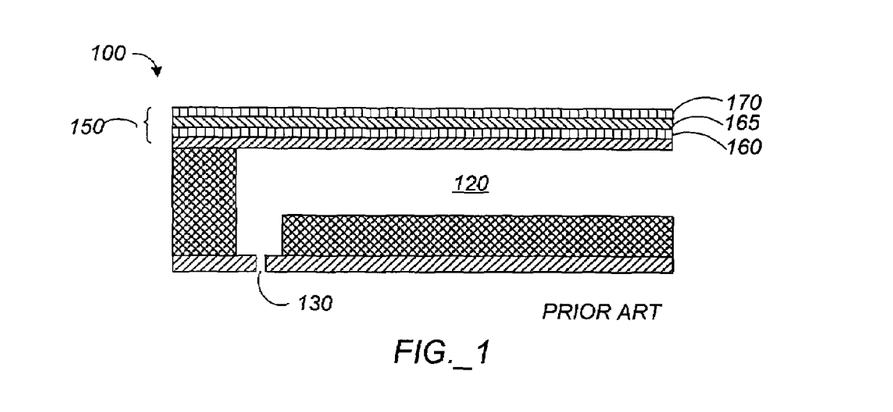
FIG. 1 is a side view of a single flow path in a printhead with a piezoelectric actuator.

In so-called "drop on demand" printers, multiple individual flow paths each with an associated pumping chamber 120 and nozzle 130, can be formed in a single printhead 100 and each nozzle 130 can be individually activated. Thus, a particular nozzle fires only when a droplet of ink from that nozzle is desired. To activate a particular actuator on the printhead, an electrical signal can be individually communicated to that actuator.

SUMMARY

In general, in one aspect, the invention features an actuator having an electrode and a piezoelectric layer adjacent to the electrode. The electrode has a first portion and a second portion. An insulating layer is disposed between the piezoelectric layer and the electrode. The first portion of the electrode contacts the insulating layer and the second portion of the electrode contacts the piezoelectric layer.

In another aspect, the invention features a printhead structure having a substrate and an actuator. The substrate has a pumping chamber formed in an upper region of the substrate and a nozzle, where the pumping chamber is in fluidic communication with the nozzle. The actuator has an electrode and a piezoelectric layer adjacent to the electrode. The electrode has a first portion and a second portion. An insulating layer is disposed between the piezoelectric layer and the electrode. The first portion of the electrode contacts the insulating layer and the second portion of the electrode contacts the piezoelectric layer. The actuator is bonded to an upper surface of the substrate. The second portion of the electrode may substantially overlie the pumping chamber.

Particular implementations can include one or more (or none) of the following advantages. The actuator can have reduced capacitance. The area of the actuator layer to which power is provided can be reduced. The boundaries of the insulating layer can be accurately defined, so that the activated area of each actuator can be uniform from one actuator to the next. The drive power can be concentrated in the active portion of each actuator, effectively increasing the gain of the actuator. By sandwiching an insulating layer between a piezoelectric layer and an electrode in a non-active area of the actuator, the amount of power that needs to be applied to the actuator to activate the piezoelectric material in an active area may be reduced. The power required to drive the device can be reduced, or the device can be powered for a longer period of time than a conventional device using the same amount of power. An oxide material can be used for the insulating layer. Alternatively, a nitride, oxynitride or polyimide can be used for the insulating layer. Oxide materials can be very stable and can be deposited using conventional semiconductor processing techniques. Oxides, nitrides, oxynitrides and polyimides can be easily patterned and easily defined.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

This invention provides techniques for reducing the power required to drive a piezoelectric actuator. The invention can be applied to fluid ejecting microelectromechanical devices, such as printhead structures, or other microelectromechanical devices that use a piezoelectric actuator.

Figure 2:
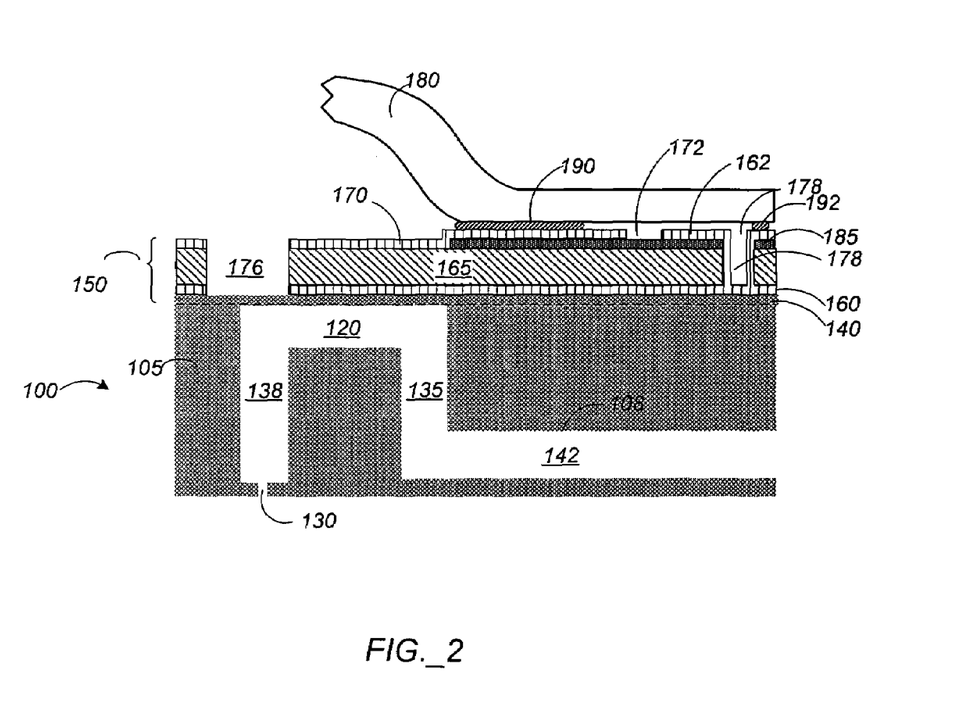
FIG. 2 is a cross-sectional view of a printhead actuator with a flexible circuit bonded to the actuator.

Referring to FIG. 2, a printhead 100 includes a substrate 105 in which multiple flow paths are formed. A single flow path 108 can include an ink inlet 142, an ascender 135, a pumping chamber 120, a descender 138 and a nozzle 130. A piezoelectric actuator 150 is supported by the substrate 105. The actuator 150 can include a membrane 140, such as a membrane of silicon, which seals one side of the pumping chamber 120. The actuator 150 includes a lower electrode 160, a piezoelectric layer 165 and an upper electrode item 170. The electrodes 160, 170 can be about two microns in thickness or less, such as about 0.5 microns. The piezoelectric layer 165 can be between about 1 and 25 microns thick, e.g., about 8 to about 18 microns thick. The electrodes 160, 170 are formed of a conductive material, such as a metal. An electrode separation 172 can be formed to electrically separate the two electrodes. A signal can be provided by a flexible circuit 180 electrically contacting the electrodes 160, 170 to electrically activate the actuator 150. An electrically conducting material, such as a metal 190, 192, can form an electrical bridge between the flexible circuit and the electrodes 160, 170.

Kerfs 174, 176, 178 separate individual actuators. A first kerf 178 allows a metal wrap around 123 to be formed so that the lower electrode 160 can be electrically connected to the upper side of the piezoelectric layer 165. A second kerf (not shown) can separate the actuator over one flow path from the actuator over a neighboring flow path. A third kerf 176 in the actuator 150 can separate neighboring actuators. In addition, the third kerf 176 can reduce the actuator size such that the actuator is only over a portion of each corresponding flow path. The first three kerfs can reduce crosstalk between the actuators.

Figure 3:
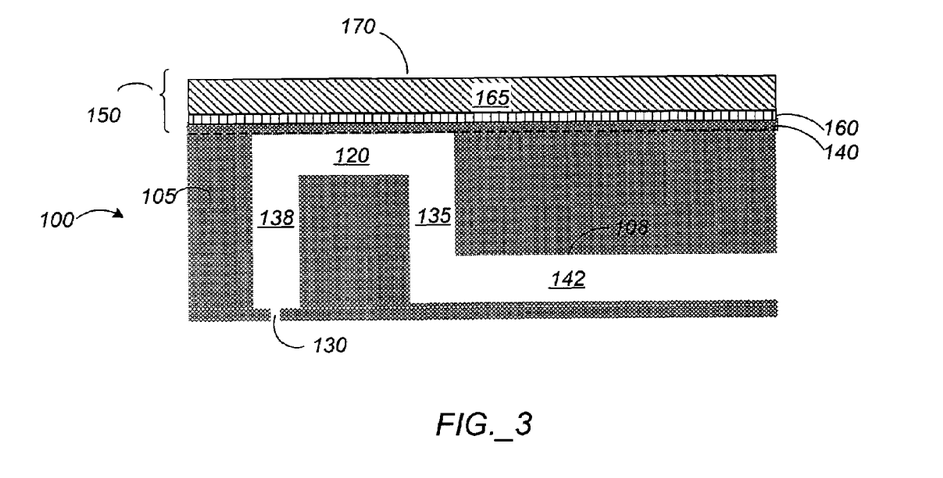
FIGS. 3 and 4 are cross-sectional views of a partially formed piezoelectric actuator.

Referring to FIG. 3, a substrate 105 with the flow path features formed therein is provided and the first layers of the actuator 150 are formed on a back side of the substrate 105. In one implementation, a piezoelectric layer 165 is metalized with a metal that will subsequently form the lower electrode 160. The piezoelectric layer 165 can be formed of a ceramic green sheet or a prefired piezoelectric material. The metal can be deposited by sputtering. The metals for deposit can include copper, gold, tungsten, tin, indium-tin-oxide (ITO), titanium, platinum, nickel, nickel chromium alloy or a combination of two or more of these metals. The piezoelectric layer 165 is then bonded onto the substrate, such as with an adhesive or with a eutectic bond between two metals. In another implementation, the substrate 105 is metallized and the piezoelectric layer 165 is formed on the metal layer, such as by physical vapor deposition (PVD), sol gel application, bonding ceramic green sheets or another suitable deposition process.

Figure 4:
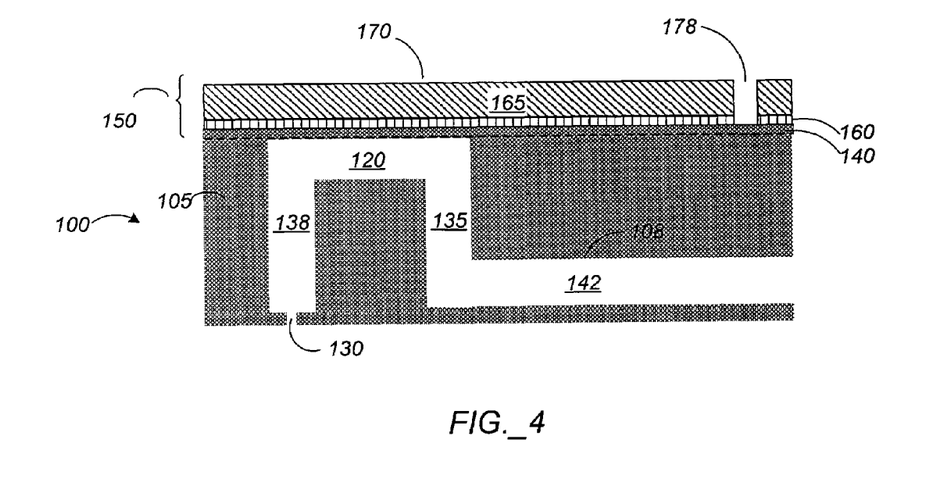

Referring to FIG. 4, a kerf 178 is formed in the piezoelectric layer 165. The kerf 178 can be cut, diced, sawed or etched into the piezoelectric layer 165. The kerf 178 can extend into the lower electrode 160 as well as the piezoelectric layer 165. Alternatively, this kerf 178 can be formed after the insulating layer is deposited.

Figure 5A:
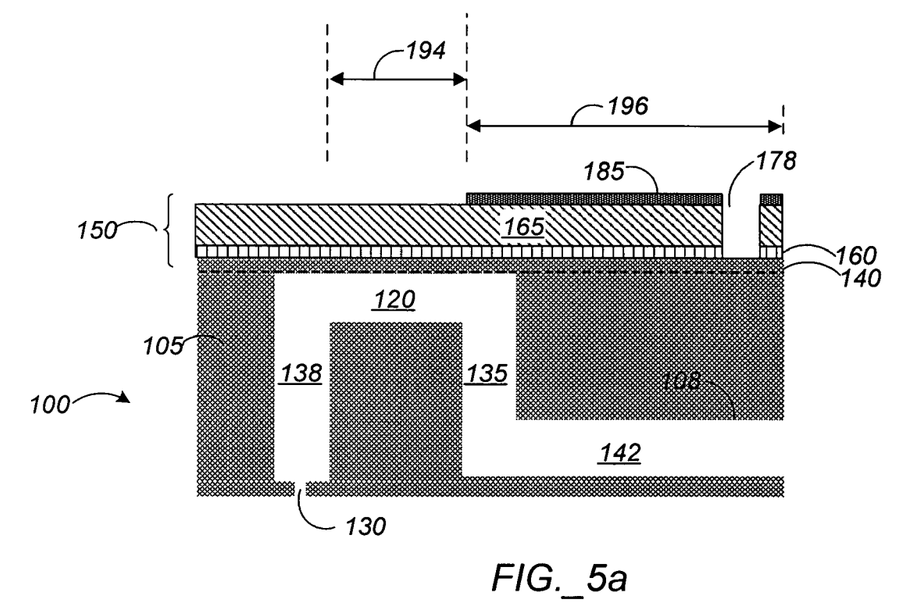
FIGS. 5A, 5B and 5C are cross-sectional views of a partially complete printhead actuator, where the actuator has an insulating layer.
Figure 5B:
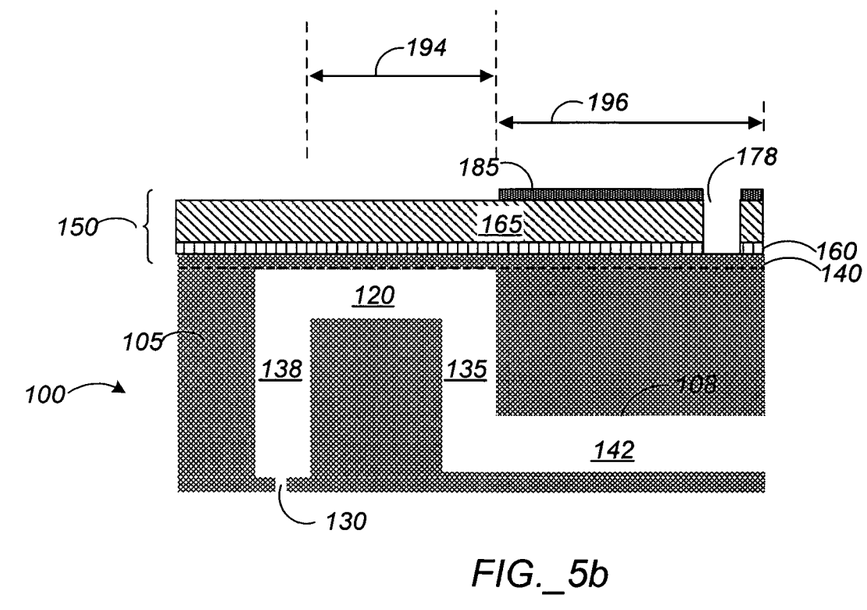
Figure 5C:
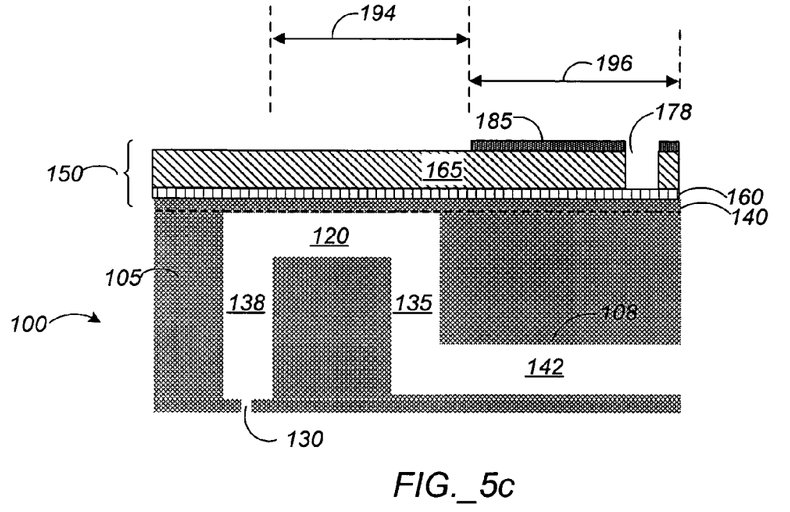

Referring to FIGS. 5A, 5B and 5C, an insulating layer 185 is formed on the piezoelectric layer 165 of the actuator 150, such as by using a plasma enhanced chemical vapor deposition (PECVD) technique. The insulating layer can include an oxide, such as silicon oxide, or other materials with insulating properties, such as a nitride, oxynitride, polyimide or other patternable materials. The insulating layer 185 can be formed with a thickness between about 0.1 and 10 microns, between about 0.2 and 5 microns, or about 0.5 and 2 microns, such as about 1.0 micron. A photopatternable material or photoresist can be applied to the surface of the insulating layer 185. A mask is provided over the photoresist. The mask pattern is selected based on whether the photoresist is positive or negative and the pattern corresponds to the desired coverage area of the insulating layer 185. As described further below, the mask determines the extent of the insulating layer 185. The photoresist is exposed and developed, and the insulating layer 185 is then etched, such as by a dry etch process, in the areas no longer covered by the photoresist. Inductively coupled plasma reactive ion etching is one example of an etch process that can be used to etch the insulating layer 185. Other etch processes can include a wet etch, such as a hydrofluoric acid etch, or a buffered oxide etch. The remaining photoresist is then removed from the piezoelectric layer 165.

Portions of the actuator 150 that actuate the pumping chamber 120, or that have an electrode and piezoelectric material without any insulator material between the electrode and the piezoelectric material, define the active regions 194 of the actuator 150. Portions of the actuator 150 that either do not include an electrode or have an insulator between the electrode and the piezoelectric layer 165 define non-active regions 196 of the actuator 150. The insulating layer 185 is formed in the non-active area 196 of the actuator 150 so that the insulating layer is sandwiched between the piezoelectric layer 165 and the upper electrode in an area where activating the piezoelectric layer 165 is not required to expel ink from the printhead. The insulating layer 185 acts as a resistive and capacitive impedance between the upper and lower electrodes, thereby reducing the voltage that is applied across the portions of the piezoelectric layer 165 that are located adjacent the insulating layer 185. The insulating layer 185 need not end in exact alignment with the boundaries of any parts of the printhead, such as the pumping chamber 120 or ascender 135.

The insulating layer 185 can be formed either so that the layer 185 covers a portion of the pumping chamber 120, such as the portion of the pumping chamber that is connected to the ascender 135 (as shown in FIG. 5A), so that the insulating layer 185 ends at the edge of the pumping chamber 120 (as shown in FIG. 5B), or in the last case, so that the insulating layer 185 is located only in areas that do not overlie the pumping chamber 120 (as shown in FIG. 5C). In any of the above implementations, the portion of the piezoelectric layer 165 that is covered by the insulating layer 185 can be substantially uniform from one flow path to another in a printhead.

Figure 6:
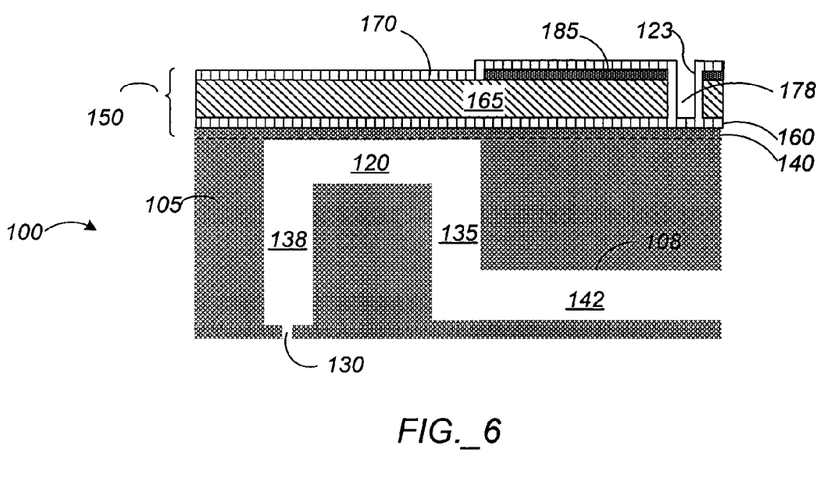
FIGS. 6 and 7 are cross-sectional views of a partially completed printhead actuator.

As shown in FIG. 6, the piezoelectric layer 165 and insulating layer 185 can be metalized, such as by vacuum depositing, e.g., sputtering, to form the upper electrode 170, the lower electrode contact area 162 and a wrap-around connector 123 on the walls of the kerf 178. The wrap-around connector 123 is electrically connected to both the lower and upper electrodes 160, 170 at this stage in the processing.

Figure 7:
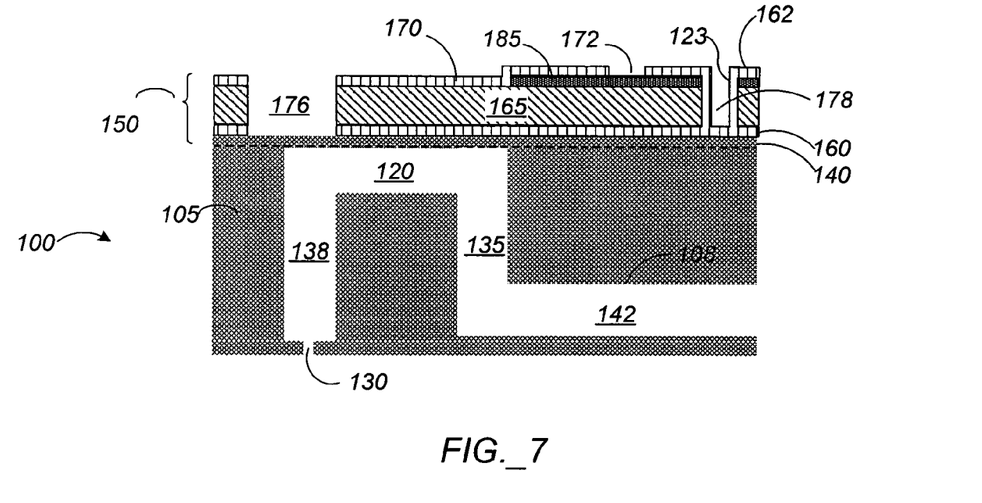

As shown in FIG. 7, the additional kerf 176 are formed in the upper electrode 170 and the piezoelectric layer 165. Kerf 176 can be cut either through the lower electrode 160 or so that the lower electrode 160 is not removed. An electrode separation 172 can be patterned so that the upper and lower electrodes are not in electrical communication with one another.

Figure 8:
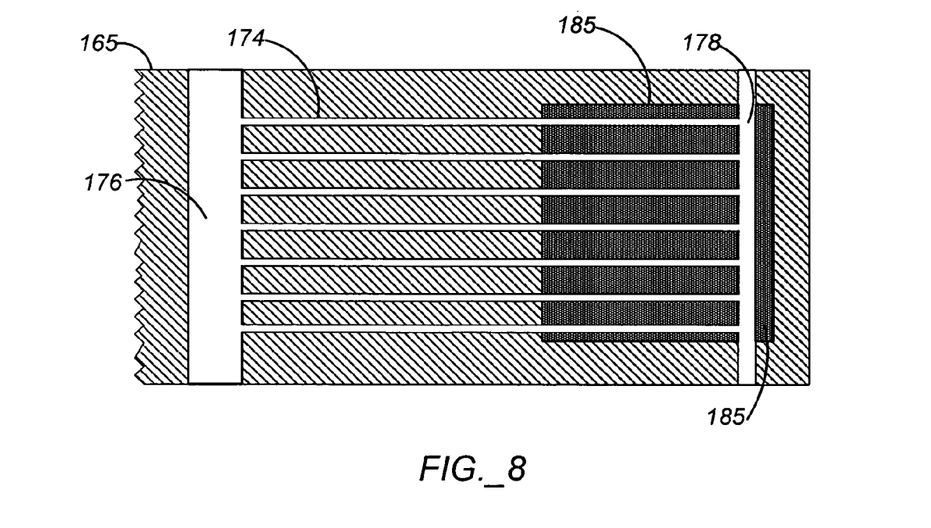
FIG. 8 shows a plan view of the actuator after the insulating layer has been formed.

As shown in FIG. 8, a top view of the piezoelectric layer 165 shows kerfs 174, 176, 178 and the insulating layer 185.

Figure 9:
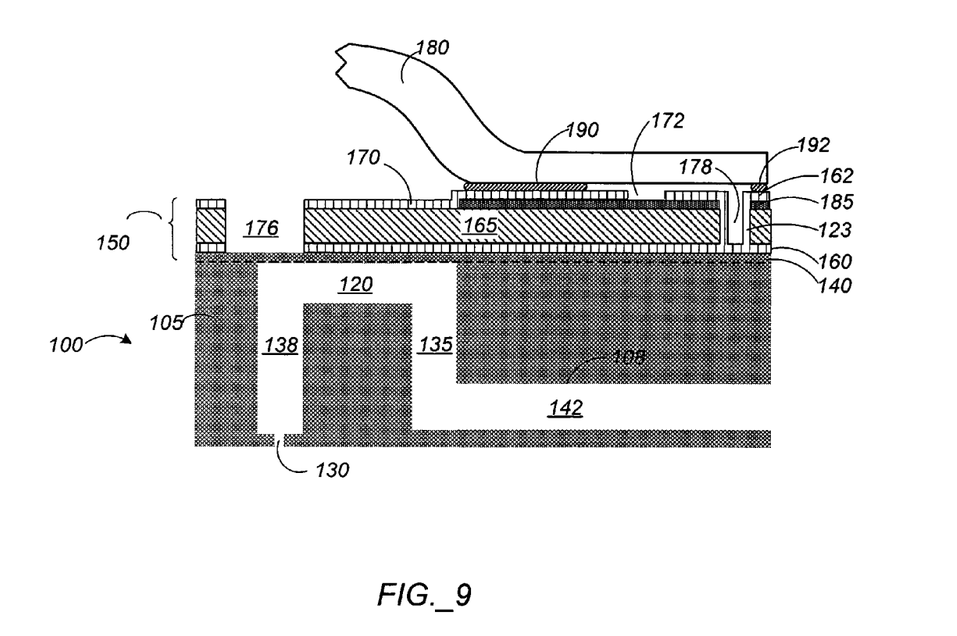
FIG. 9 is a cross-sectional view of a printhead actuator with a flexible circuit bonded to the actuator.

As shown in FIG. 9, the lower electrode contact area 162 and the upper electrode 170 then can be electrically connected to an integrated circuit, such as by bonding the electrodes to a flexible circuit 180, e.g., by soldering the flexible circuit 180 to the upper electrode with a metal 190, 192 or by using a conductive adhesive, such as an anisotropic conductive film.

The portion of the piezoelectric layer that is not over the pumping chamber does not need to be activated, because it does not participate in causing ink to be ejected from the printhead. Therefore, power can be directed away from the non-active portions of the piezoelectric layer. The insulating layer reduces the drive power applied across the two electrodes in the region where the insulting layer is located. Consequently, the insulator layer causes the power applied to the electrodes to be concentrated in the active area of the piezoelectric actuator, effectively increasing the gain of the actuator. Because the power is directed preferentially to the portions of the piezoelectric layer that need to be activated, a lower overall amount of power is required to activate the piezoelectric layer. Thus, less power need be applied to achieve the same piezoelectric layer displacement, as compared to an actuator without the insulating layer.

Reducing the power required to activate each actuator can reduce the overall power requirements of a group actuators that correspond to multiple flow paths on a printhead. If less power is required to run the device, the printhead can be powered for a longer period of time than a conventional printhead using the same amount of power. A printhead requiring less power input can be safer for printhead operators. A printhead that requires less power may be less prone to electrical break down and subsequent replacement.

Forming an insulating layer on each actuator of a group of actuators can reduce the area of the actuator to which power is provided. If the area of each actuator is reduced uniformly over a group of actuators, the uniformity of the actuators can be maintained.

A number of embodiments of the invention have been described. Nevertheless, it will be understood that various modifications may be made without departing from the spirit and scope of the invention. For example, the piezoelectric actuator can form a side wall of the pumping chamber of a printhead. In one implementation, only one electrode is present to drive the actuator. The actuator structure can be used in microfabricated electromechanical devices other than printheads, such as transducers or sensors. Accordingly, other embodiments are within the scope of the following claims.

What is claimed is:

1. An actuator, comprising:
  a membrane;
  a first electrode having a first portion and a second portion;
  a piezoelectric layer having a first surface adjacent to the membrane and a second surface adjacent to the first electrode, the first surface being opposite to the second surface; and
  an insulating layer disposed between the piezoelectric layer and the first electrode;
  wherein the first portion of the first electrode contacts the insulating layer and the second portion of the first electrode contacts the piezoelectric layer.

2. The actuator of claim 1, wherein the insulating layer includes an oxide material.

3. The actuator of claim 1, wherein the first electrode is electrically connected to an integrated circuit.

4. The actuator of claim 1, wherein the insulating layer is between about 0.1 and about 5 microns thick.

5. The actuator of claim 4, wherein the insulating layer is between about 0.5 and about 2 microns thick.

6. The actuator of claim 1, further comprising a second electrode, wherein the piezoelectric layer is disposed between the first electrode and the second electrode.

7. A method for forming the actuator of claim 1, comprising:
  depositing the layer of insulating material on the first surface of the piezoelectric layer;
  patterning the layer of insulating material so that the insulating material is located over the first portion of the piezoelectric layer;
  forming the first electrode so that the first electrode contacts the insulating material and the first surface of the piezoelectric layer over a second portion of the piezoelectric layer, and
  bonding the piezoelectric layer to the membrane causing the piezoelectric layer to be between the membrane and the insulating layer.

8. The method of claim 7, wherein depositing the layer of insulating material includes depositing a layer of insulating material on a piezoelectric layer having a second electrode on a second surface.

9. The method of claim 7, wherein depositing the layer of insulating material occurs prior to forming the first electrode.

10. The method of claim 7, wherein depositing the layer of insulating material includes depositing a layer of oxide material.

11. The method of claim 7, wherein the membrane comprises silicon.

12. A printhead structure, comprising:
  a substrate having a pumping chamber formed adjacent to an upper surface of the substrate and a nozzle, wherein the pumping chamber is in fluidic communication with the nozzle; and
  an actuator comprising:
    a membrane:
    a first electrode having a first portion and a second portion;
    a piezoelectric layer having a first surface adjacent to the membrane and a second surface adjacent to the first electrode, the first surface being opposite to the second surface; and
    an insulating layer disposed between the piezoelectric layer and the first electrode;
    wherein the first portion of the first electrode contacts the insulating layer and the second portion of the first electrode contacts the piezoelectric layer;
    wherein the actuator is connected to the upper surface of the substrate.

13. The printhead structure of claim 12, wherein the second portion of the first electrode substantially overlies the pumping chamber.

14. The printhead structure of claim 13, further comprising an integrated circuit electrically coupled to the first electrode.

15. The printhead structure of claim 13, wherein the insulating layer includes an oxide material.

16. The printhead structure of claim 13, wherein:
  the first electrode has a thickness equal to or less than about two microns; and
  the insulating layer has a thickness of between about 0.1 and 5 microns.

17. The printhead structure of claim 13, further comprising a second electrode, wherein the piezoelectric layer is disposed between the first and second electrodes.

18. A method of forming the printhead structure of claim 12, comprising:
  depositing the layer of insulating material on the first surface of the piezoelectric layer;
  patterning the layer of insulating material so that the insulating material is located over a first portion of the piezoelectric layer;
  forming the first electrode so that the first electrode contacts the insulating material and the first surface of the piezoelectric layer over a second portion of the piezoelectric layer; and
  bonding the piezoelectric layer to the upper surface of the substrate.

19. The method of claim 18, wherein the substrate includes an ink flow path.

20. The method of claim 18, wherein:
patterning the insulating layer removes a portion of the insulating layer that is located over at least a portion of the pumping chamber.

21. The method of claim 20, wherein depositing a layer of insulating material includes depositing a layer of oxide that is between about 0.5 microns to about 2 microns thick.

22. The method of claim 21, further comprising electrically connecting an integrated circuit to the first electrode.

23. The method of claim 18, wherein bonding the piezoelectric layer to an upper surface of the substrate includes bonding the piezoelectric layer to the substrate so that a second electrode is between the piezoelectric layer and the substrate.

* * * * *